United States Patent
Su

(10) Patent No.: US 11,894,101 B2
(45) Date of Patent: Feb. 6, 2024

(54) SENSE AMPLIFIER, MEMORY AND CONTROL METHOD

(71) Applicant: CHANGXIN MEMORY TECHNOLOGIES, INC., Hefei (CN)

(72) Inventor: Hsin-Cheng Su, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 180 days.

(21) Appl. No.: 17/647,552

(22) Filed: Jan. 10, 2022

(65) Prior Publication Data

US 2022/0310142 A1 Sep. 29, 2022

Related U.S. Application Data

(63) Continuation of application No. PCT/CN2021/107888, filed on Jul. 22, 2021.

(30) Foreign Application Priority Data

Mar. 24, 2021 (CN) .......................... 202110314431.5

(51) Int. Cl.
*G11C 7/06* (2006.01)
*G11C 7/12* (2006.01)
(Continued)

(52) U.S. Cl.
CPC .................. *G11C 7/12* (2013.01); *G11C 7/08* (2013.01); *G11C 7/1096* (2013.01)

(58) Field of Classification Search
CPC ............ G11C 7/12; G11C 7/08; G11C 7/1096
See application file for complete search history.

(56) References Cited

U.S. PATENT DOCUMENTS 5,526,313 A 6/1996 Etoh
5,659,260 A 8/1997 Kajimoto
(Continued)

FOREIGN PATENT DOCUMENTS

CN 1496568 A 5/2004
CN 101140798 A 3/2008
(Continued)

OTHER PUBLICATIONS

First Office Action of the Chinese application No. 202110314347.3, dated Feb. 22, 2022.
(Continued)

*Primary Examiner* — Min Huang
(74) *Attorney, Agent, or Firm* — Syncoda LLC; Feng Ma

(57) ABSTRACT

Sense amplifier, memory and control method are provided. The sense amplifier includes: amplify module configured to amplify voltage difference between bit line and reference bit line when the sense amplifier is in amplifying stage; write module connected to the bit line and the reference bit line, and configured to pull the voltage difference between the bit line and the reference bit line according to data to be written when the sense amplifier is in write stage; controllable power module connected to the amplify module, configured to provide first voltage to the amplify module when the sense amplifier is in non-write stage, and to provide second voltage to the amplify module when the sense amplifier in write stage. Herein, the second voltage is less than the first voltage, and the second voltage is in positive correlation with the drive capability of the write module.

17 Claims, 12 Drawing Sheets

(51) Int. Cl.
*G11C 7/10* (2006.01)
*G11C 7/08* (2006.01)

(56) References Cited

U.S. PATENT DOCUMENTS

| | | | |
|---|---|---|---|
| 6,147,916 A | 11/2000 | Ogura | |
| 6,819,600 B2 | 11/2004 | Sim | |
| 6,847,568 B2 | 1/2005 | Gogl | |
| 7,394,714 B2* | 7/2008 | Lin | G11C 5/14 |
| | | | 365/189.09 |
| 7,450,455 B2 | 11/2008 | Kang | |
| 7,663,953 B2 | 2/2010 | Cheng | |
| 7,928,962 B2* | 4/2011 | Lee | G06F 1/3203 |
| | | | 323/318 |
| 8,295,101 B2 | 10/2012 | Kajigaya | |
| 8,797,817 B2 | 8/2014 | Joo | |
| 8,873,307 B2 | 10/2014 | Kajigaya | |
| 9,431,071 B2 | 8/2016 | Moon et al. | |
| 9,449,680 B2 | 9/2016 | Huang | |
| 10,388,355 B1 | 8/2019 | Ware et al. | |
| 2004/0027892 A1 | 2/2004 | Sim | |
| 2004/0218446 A1 | 11/2004 | Gogl | |
| 2007/0076501 A1 | 4/2007 | Kang et al. | |
| 2008/0062802 A1 | 3/2008 | Lin | |
| 2008/0123457 A1* | 5/2008 | Lee | G11C 11/4094 |
| | | | 365/207 |
| 2011/0205812 A1 | 8/2011 | Kajigaya | |
| 2012/0081986 A1* | 4/2012 | Joo | G11C 11/4091 |
| | | | 365/207 |
| 2013/0021856 A1 | 1/2013 | Kajigaya | |
| 2016/0012868 A1* | 1/2016 | Moon | G11C 7/065 |
| | | | 365/189.11 |
| 2016/0196868 A1 | 7/2016 | Huang | |
| 2018/0062640 A1* | 3/2018 | Lovett | G11C 8/10 |
| 2021/0005243 A1 | 1/2021 | Bae | |
| 2022/0310133 A1* | 9/2022 | Su | G11C 11/4091 |

FOREIGN PATENT DOCUMENTS

| | | |
|---|---|---|
| CN | 102394094 A | 3/2012 |
| CN | 101562042 B | 6/2012 |
| CN | 102881318 A | 1/2013 |
| CN | 103021455 A | 4/2013 |
| CN | 103123808 A | 5/2013 |
| CN | 103594111 A | 2/2014 |
| CN | 105976859 A | 9/2016 |
| CN | 106205676 A | 12/2016 |
| CN | 109712651 A | 5/2019 |
| CN | 111739565 A | 10/2020 |
| CN | 111863049 A | 10/2020 |
| CN | 111863052 A | 10/2020 |
| CN | 111863053 A | 10/2020 |
| CN | 111863055 A | 10/2020 |
| CN | 112447208 A | 3/2021 |
| CN | 112992200 A | 6/2021 |
| CN | 112992201 A | 6/2021 |
| CN | 112992202 A | 6/2021 |
| CN | 112992203 A | 6/2021 |
| CN | 113012729 A | 6/2021 |
| JP | S58102389 A | 6/1983 |
| KR | 20040003210 A | 1/2004 |
| TW | M358390 U | 6/2009 |
| WO | 2021036104 A1 | 3/2021 |

OTHER PUBLICATIONS

Rahul Sarpeshkar, John L. Wyatt, Jr., Nicky C. Lu, Porter D. Gerber, "Mismatch Sensitivity of a Simultaneously Latched CMOS Sense Amplifier", IEEE Journal of Solid-State Circuits, vol. 26, No. 10, pp. 1413-1422, 1991.

* cited by examiner

SENSE AMPLIFIER, MEMORY AND CONTROL METHOD

CROSS-REFERENCE TO RELATED APPLICATION

The present application is a continuation of International Patent Application No. PCT/CN2021/107888 filed on Jul. 22, 2021, which claims priority to Chinese patent application No. 202110314431.5 filed on Mar. 24, 2021. The disclosures of the above-referenced applications are incorporated herein by reference in their entirety.

BACKGROUND

With the popularity of electronic devices such as mobile phones, pads, personal computers, semiconductor memory technologies are also developing rapidly.

A Sense Amplifier (SA for short) is an important component of the semiconductor memory, the main function is to amplify small signals on a bit line, and then perform read or write operation. The sense amplifier includes a write circuit and an amplify circuit, and when writing data into a memory cell, the write circuit and the amplify circuit will pull the voltage of the bit line and the voltage of a reference bit line.

However, if the drive capability of the write circuit is weak relatively to the drive capability of the amplify circuit, the write circuit cannot pull the voltage of the bit line and the voltage of the reference bit line according to data to be written, so that the sense amplifier cannot turn over, thereby resulting in a failure of the write data.

SUMMARY

This disclosure relates to the field of integrated circuit, and in particular to a sense amplifier, a memory and a control method.

This disclosure provides a sense amplifier, which includes an amplify circuit, a write circuit and a controllable power circuit.

The amplify circuit is configured to amplify a voltage difference between a bit line and a reference bit line when the sense amplifier is in an amplifying stage.

The write circuit is connected to the bit line and the reference bit line, and is configured to pull the voltage difference between the bit line and the reference bit line according to data to be written when the sense amplifier is in a write stage.

The controllable power circuit is connected to the amplify circuit, and is configured to provide a first voltage to the amplify circuit when the sense amplifier is in a non-write stage, and to provide a second voltage to the amplify circuit when the sense amplifier in a write stage. The second voltage is less than the first voltage, and the second voltage is in positive correlation with the drive capability of the write circuit.

According to a second aspect, this disclosure provides a memory, which includes the sense amplifier involved in the first aspect and the optional solutions and memory cells.

Parts of memory cells form a first memory array, other parts of memory cells form a second memory array, the sense amplifier is located between the first memory array and the second memory array, a third end of the sense amplifier is connected to a bit line of the first memory array, and a fourth end of the sense amplifier is connected to a bit line of the second memory array.

According to a third aspect, this disclosure provides a method for controlling a sense amplifier, the sense amplifier includes an amplify circuit, a controllable power circuit and a write circuit, and the method includes the following operations.

A working state of the amplify circuit is obtained, and the working state includes a write stage and a non-write stage.

A control signal for controlling the controllable power circuit is generated according to the working stage, to able the controllable power circuit to provide a first voltage to the amplify circuit in the non-write stage, and provide a second voltage to the amplify circuit in the write stage. The second voltage is in positive correlation with the drive capability of the write circuit.

DETAILED DESCRIPTION

In order to make the objective, technical solution and advantages of this disclosure more clear, the technical solutions in this disclosure are clearly and completely elaborated below in combination with the drawings. It is apparent that the described embodiments are only a part of the embodiments of this disclosure but not all. Based on the embodiments of this disclosure, all the other embodiments obtained by those of ordinary skill in the art on the premise of not contributing creative effort should belong to the protection scope of this disclosure.

Figure 1:
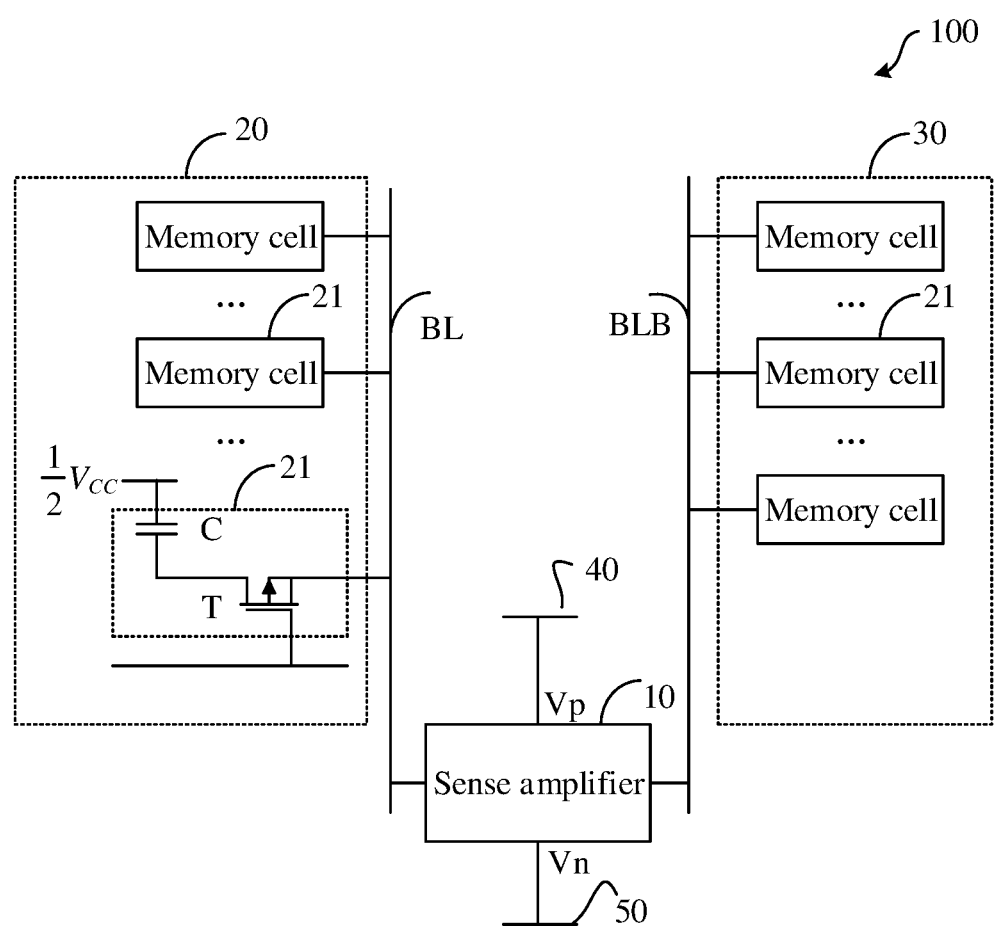
FIG. 1 is a structural schematic diagram of a memory according to an embodiment of this disclosure.

As illustrated in FIG. 1, an embodiment of this disclosure provides a memory 100, which includes a sense amplifier 10 and multiple memory cells 21. Parts of multiple memory cells memory cells 21 form a first memory array 20, and other parts of multiple memory cells 21 form a second memory array 30. Each memory cell 21 in the first memory array 20 is connected to a bit line BL of the first memory array 20, and each memory cell 21 in the second memory array 30 is connected to a bit line BL of the second memory array 30.

The sense amplifier 10 is located between the first memory array 20 and the second memory array 30, a first end Vp of the sense amplifier 10 is configured to connect to a first power 40, a second end Vn of the sense amplifier 10 is also configured to connect to a second power 50, a third end of the sense amplifier 10 is connected to the bit line BL of the first memory array 20, and a fourth end of the sense amplifier 10 is connected to the bit line BL of the second memory array 30.

Each memory cell 21 is configured to store one-bit data, the bit line BL of the first memory array 20 is configured to access the data stored in each memory cells 21 in the first memory array 20, and the bit line BL of the second memory array 30 is configured to access the data stored in each memory cells 21 in the second memory array 30. The sense amplifier 10 is configured to amplify the data stored in each memory cells 21 and present the data on the bit line BL of the first memory array 20 and the bit line BL of the second memory array 30. The sense amplifier 10 is also configured to recover, after completing once data read operation, the memory cells 21 to the state before performing the read operation.

Herein, each memory cell 21 includes a storage capacitor C and an access transistor T, a first end of the storage capacitor C is connected to a charging power 0.5 $V_{CC}$, a second end of the storage capacitor C is connected to a first end of the access transistor T, a second end of the access transistor T is connected to the bit line BL, and a control end of the access transistor T is connected to a word line.

Large and little of the charge stored in the storage capacitor C or high and low of voltage difference between the two ends of the storage capacitor C express the logic 1 and 0. The access transistor T is configured to control whether the read operation or the rewrite operation performed on the information stored in the storage capacitor C is allowed or prohibited.

For convenient description, when writing data in a memory cell 21 in the first memory array 20, the bit line of the first memory array 20 is called as the bit line BL, and the bit line of the second memory array 30 is called as the reference bit line BLB. When writing data in a memory cell 21 in the second memory array 30, the bit line of the second memory array 30 is called as the bit line BL, and the bit line of the first memory array 20 is called as the reference bit line BLB.

Usually, a write circuit and an amplify circuit are arranged in the sense amplifier. The write circuit pulls the voltage of the bit line BL and the voltage of the reference bit line BLB, and then the bit line BL charges the storage capacitor in the memory cell or the storage capacitor discharges to the bit line BL, so as to implement data writing.

Figure 2:
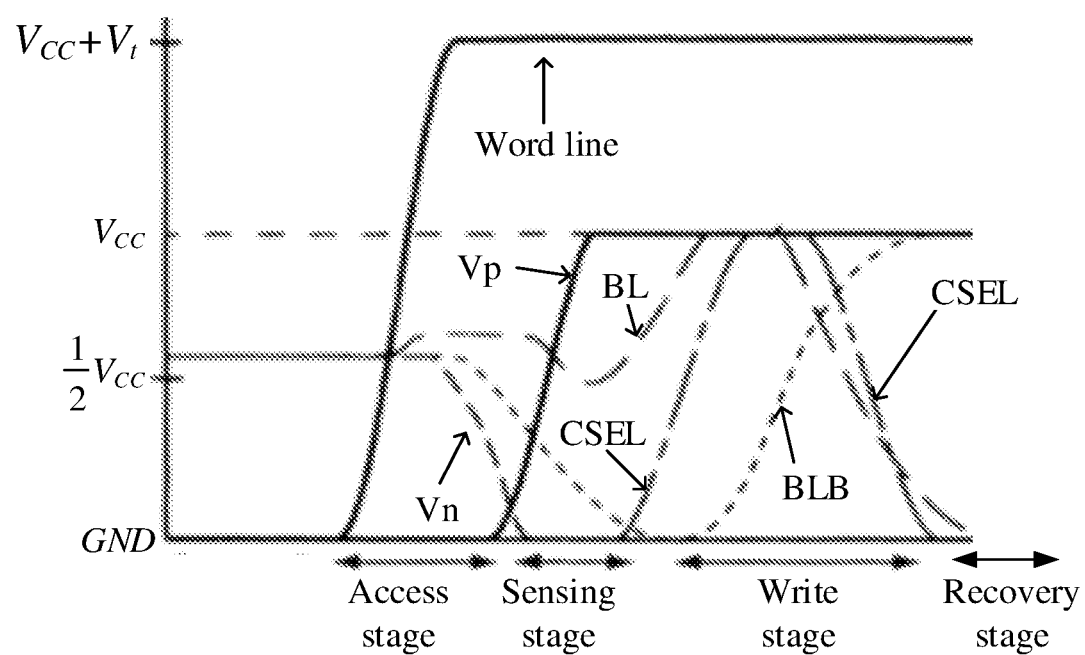
FIG. 2 is a timing diagram of writing data according to another embodiment of this disclosure.

The process that the sense amplifier writes the data "0" in one memory cell 21 of the first memory array 20 is described below in combination with FIG. 2. Writing data includes an access stage, a sensing stage, a write stage and a recovery stage.

In the access stage, the initial value of the voltage of the bit line BL and the voltage of the reference bit line BLB of the first memory array 20 is 0.5 Vcc, a signal in the word line corresponding to the accessed memory cell 21 is controlled, so that the access transistor T in the accessed memory cell 21 is conductive, and the storage capacitor C enables the bit line BL to be changed. For example, if the data stored in the storage capacitor C is "1", the storage capacitor C enables the voltage of the bit line BL to be ascended, and the voltage of the bit line BL is higher than 0.5 Vcc.

In the sensing stage, the voltage difference between the bit line BL and the reference bit line BLB is amplified by the amplify module 101, so that the voltage of the bit line BL continues to ascend towards a voltage direction of the first power 40, and the voltage of the reference bit line BLB descends towards a voltage direction of the second power 50.

In the write stage, the column selection signal is controlled, the voltage of the reference bit line BLB and the voltage of the bit line BL are pulled by the write circuit according to the voltage corresponding to the logic data "0", namely, the voltage of the reference bit line BLB is pulled upwards, and the voltage of the bit line BL is pulled downwards, so that the voltage of the bit line BL is lower than the voltage of the reference bit line BLB.

In the recovery stage, the sense amplifier 10 stabilizes the voltage of the bit line BL at the logic data "0" and stabilizes the voltage of the reference bit line BLB at the logic data "1"; and the bit line BL charges the storage capacitor C (when the bit line BL is "1", the current flows to the storage capacitor C from the bit line BL; when the bit line BL is "0", the current flows to the bit line BL from the storage capacitor C, and charging herein expresses the above two current directions), the storage capacitor C writes the data "0" after charging for a period of time. The access transistor is cut off by controlling the signal in the word line, and then writing of the logic data "0" is completed.

However, the write circuit and amplify circuit pull the voltage of the bit line BL and the voltage of the reference bit line BLB during a process of writing data in the memory cell 21. If the drive capability of the write circuit is weaker relatively to the drive capability of the amplify circuit, the write circuit cannot pull the voltage of the bit line BL and the voltage of the reference bit line BLB according to the data to be written, so that the sense amplifier cannot turn over, thereby resulting in a failure of the writing data.

Figure 3:
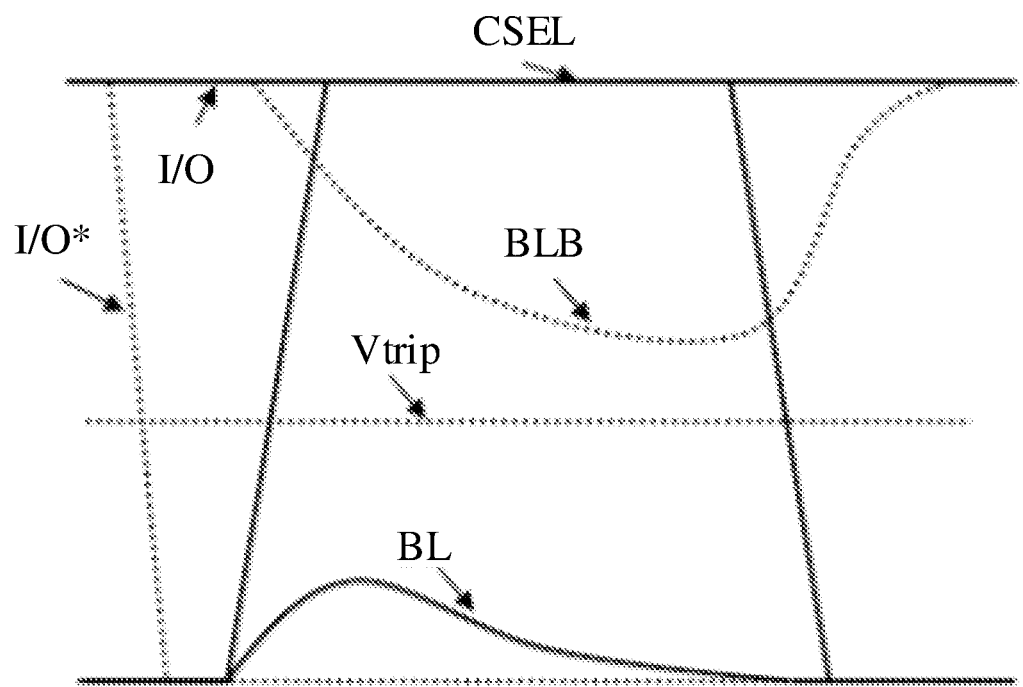
FIG. 3 is a schematic diagram of a failure of writing data when a write module has a weaker drive capability.

For example, as illustrated in FIG. 3, when writing the logic data "1" in the memory cell by using the write circuit I/O and I/O*, the descended voltage of the reference bit line BLB after turning on the column selection signal is insufficient, and thus cannot reach the voltage Vtrip of a trip-point of a inverter composed of a N-type transistor and a P-type transistor in the amplify circuit, positive feedback cannot be formed to turn over the sense amplifier, and the data to be written cannot be stably presented on the bit line BL and the reference bit line BLB, thereby resulting in a writing failure.

In order to solve the above technical problem, this disclosure provides a sense amplifier, a memory and a control method, which intends to ensure to successfully write data in a memory cell in a case that the write circuit has weak drive capability. The technical concept of this disclosure is as follows: in the write stage of the sense amplifier, the controllable power module provides the second voltage to the amplify module; and in the non-write stage of the sense amplifier, the controllable power module provides the first voltage to the amplify module. Herein, the second voltage is less than the first voltage, and the second voltage is in positive correlation with the drive capability of the write module. Compared with the non-write stage, the capability of the amplify module to pull the voltage of the bit line and the voltage of the reference bit line in the write stage is weakened, and the capabilities of the write module and the amplify module to pull the voltage of the bit line and the voltage of the reference bit line in the write stage are balanced, so as to ensure to pull the voltage of the bit line and the voltage of the reference bit line in the write stage, and ensure to successfully write data in the memory cell in a case that the drive capability of the write module is weaker.

Figure 4:
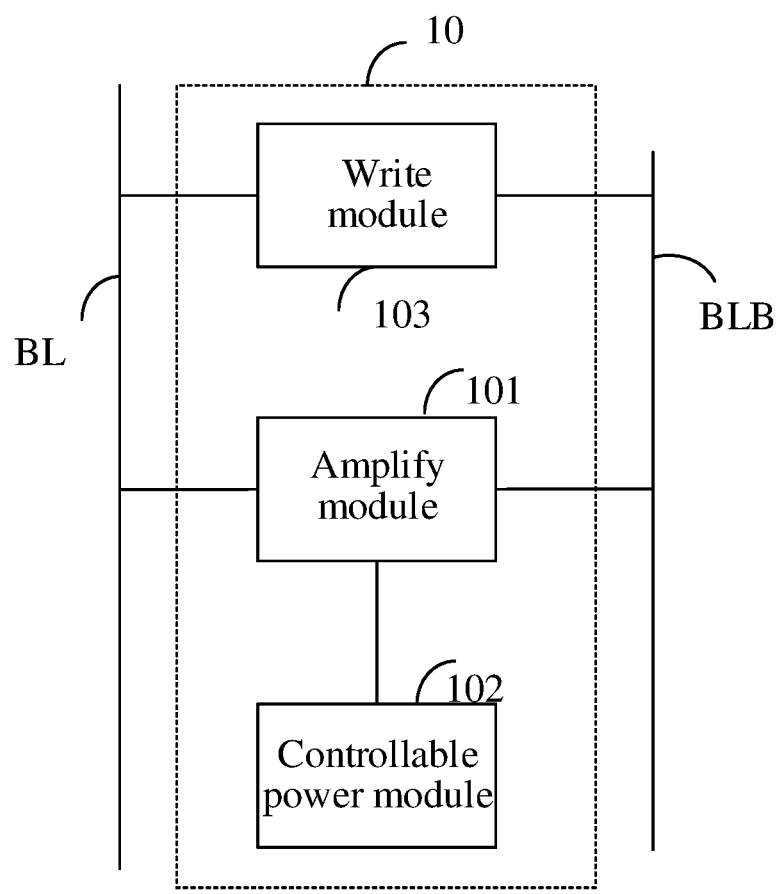
FIG. 4 is a circuit structure diagram of a sense amplifier according to another embodiment of this disclosure.

As illustrated in FIG. 4, a embodiment of this disclosure provides a sense amplifier 10, which includes an amplify module 101, a controllable power module 102 and a write module 103. Herein, the amplify module 101 is connected to the controllable power module 102, the bit line BL and the reference bit line BLB, and the write module 103 is connected to the bit line BL and the reference bit line BLB.

The amplify module 101 is configured to amplify A voltage difference between the bit line BL and the reference bit line BLB when the sense amplifier is in an amplifying stage. The write module 103 is configured to pull, when the sense amplifier 10 is in a write stage, the voltage difference between the bit line BL and the reference bit line BLB according to data to be written.

The controllable power module 102 is configured to provide the second voltage to the amplify module 101 when the sense amplifier 10 is in the write stage. The controllable power module 102 is configured to provide the first voltage to the amplify module when the sense amplifier 10 is in the non-write stage. The second voltage is less than the first voltage, and the second voltage is in positive correlation with the drive capability of the write module.

Herein, the expression that the second voltage is in positive correlation with the drive capability of the write module means that the value of the second voltage is greater when the drive capability of the write module is stronger; or the value of the second voltage is smaller when the drive capability of the write module is weaker. The drive capability of the write module may be measured by the voltage change amount for pulling the BL or BLB. In a case that other conditions are the same, the greater the voltage change for pulling the BL or BLB, the stronger the drive capability.

When the sense amplifier 10 is in the write stage, the controllable power module 102 provides a lower voltage to the amplify module 101, and the provided voltage magnitude is changed along the drive capability of the write module. The influence of the amplify module 101 on the voltage of the bit line BL and the voltage of the reference bit line BLB in the write stage is weakened, the capabilities of the write module and the amplify module to pull the voltage of the bit line and the voltage of the reference bit line in the write stage are balanced, so as to ensure that the write module may pull the voltage of the bit line BL and the voltage of the reference bit line BLB in the write stage according to the data to be written.

If the writing data is the logic data "1", the voltage of the bit line BL is pulled upwards, and meanwhile the voltage of the reference bit line BLB is pulled downwards. If the writing data is the logic data "0", the voltage of the reference bit line BLB is pulled upwards, and meanwhile the voltage of the bit line BL is pulled downwards. The influence of the amplify module 101 on the voltage of the bit line BL and the voltage of the reference bit line BLB is weakened in the write stage, so the write module may pull the voltage of the bit line BL and the voltage of the reference bit line BLB according to the data to be written, and may present the data to be written on the bit line BL and the reference bit line BLB. In the recovery stage, the controllable power module 102 is controlled to provide the first voltage to the amplify module 101, then the amplify module amplifies the voltage difference between the bit line BL and the reference bit line BLB, stably presents the data to be written on the bit line BL and the reference bit line BLB; and the access transistor T is controlled in the memory cell 21, so that charging and discharging between the storage capacitor C in the memory cell 21 and the bit line BL are performed, thereby achieving writing the data to be written in the memory cell.

In the above technical solution, the power supply voltage provided by the controllable power module to the amplify module in the write stage is lower than the power supply voltage provided by the controllable power module to the amplify module in the non-write stage; and in the write stage, the controllable power module may adaptively adjust the provided voltage magnitude according to the drive capability of the write module. The capability of the amplify module to pull the voltage of the bit line and the voltage of the reference bit line in the write stage is weakened, and the drive capability of the write module and the capability of the amplify module to pull the voltage of the bit line and the voltage of the reference bit line in the write stage are balanced, so as to realize successfully presenting the data to be written on the bit line and reference bit line in a case that the drive capability of the write module is weaker, and then successfully write the data in the memory cell.

Figure 5:
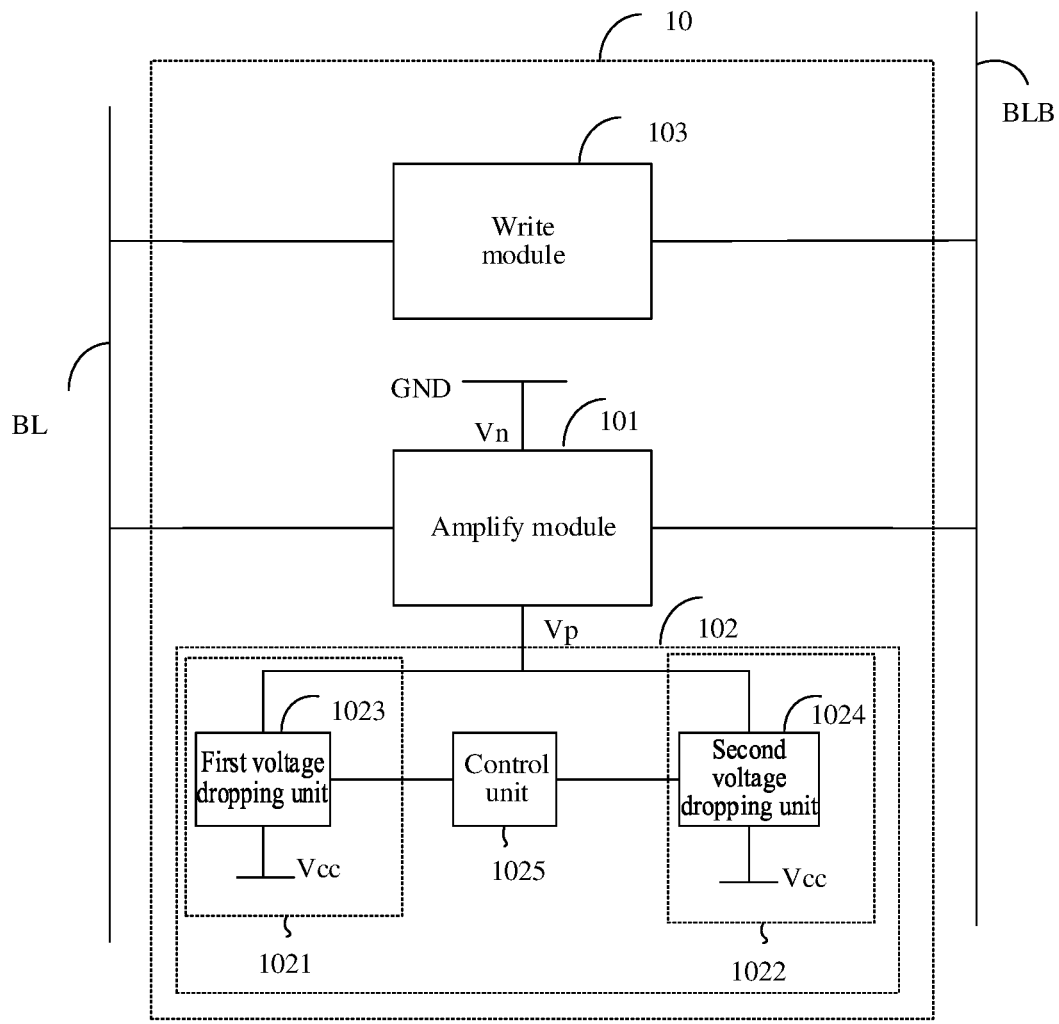
FIG. 5 is a circuit structure diagram of a sense amplifier according to another embodiment of this disclosure.

As illustrated in FIG. 5, another embodiment of this disclosure provides a sense amplifier 10, which includes an amplify module 101, a controllable power module 102 and a write module 103. Herein, the amplify module 101 is connected to the controllable power module 102, the bit line BL and the reference bit line BLB, and the write module 103 is connected to the bit line BL and the reference bit line BLB.

The controllable power module 102 includes a first controllable power unit 1021 and a second controllable power unit 1022. An output end of the first controllable power unit 1021 is connected to a first end of the amplify module 101. An output end of the second controllable power unit 1022 is connected to the first end of the amplify module 101. A control unit 1025 is connected to a control end of the first controllable power unit 1021, and the control unit 1025 is also connected to a control end of the second controllable power unit 1022. A second end of the amplify module 101 is grounded (GND), a third end of the amplify module 101 is connected to the bit line BL of the first memory array, and a fourth end of the amplify module 101 is connected to the bit line BL of the second memory array.

The first controllable power unit 1021 is configured to provide the first voltage to the amplify module 101, and the second controllable power unit 1022 is configured to provide the second voltage to the amplify module 101. The control unit 1025 is configured to control the first controllable power unit 1021 to provide the first voltage to the amplify module 101 in the non-write stage, and also configured to control the second controllable power unit to provide the second voltage to the amplify module in the write stage. The first voltage is greater than the second voltage, and the second voltage is in positive correlation with the drive capability of the write module. The capability of the amplify module to pull the voltage of the bit line BL and the voltage of the reference bit line BLB in the write stage is reduced, and the drive capability of the write module and the capability of the amplify module to pull the voltage of the bit line and the voltage of the reference bit line in the write stage are balanced.

At this time, the write module 103 pulls the voltage of the bit line BL and the voltage of the reference bit line BLB according to the data to be written, so as to ensure to pull the voltage of the bit line BL and the voltage of the reference bit line BLB in a case that the drive capability of the write module 103 is weaker. In the recovery stage, the first voltage is provided to the amplify module, the capability of the amplify module to pull the voltage of the bit line BL and the voltage of the reference bit line BLB is recovered, so that the amplify module 101 may continue to pull the voltage of the bit line BL and the voltage of the reference bit line BLB in the recovery stage, to enable that the bit line BL and the reference bit line BLB may stably present the data to be written.

In another embodiment, the first controllable power unit 1021 includes a first voltage dropping unit 1023, and the second controllable power unit 1022 includes a second voltage dropping unit 1024.

The first voltage dropping unit 1023 is provided with a first end, a second end and a control end. The first end of the first voltage dropping unit 1023 is connected to a first power supply end Vcc, the second end of the first voltage dropping unit 1023 is connected to the first end Vp of the amplify module, and the control end of the first voltage dropping unit 1023 is connected to a first output end of the control unit 1025.

The second voltage dropping unit 1024 is provided with a first end, a second end and a control end. The first end of the second voltage dropping unit 1024 is connected to a first power supply end Vcc, the second end of the second voltage dropping unit 1024 is connected to the first end Vp of the amplify module 101, and the control end of the second voltage dropping unit 1024 is connected to a second output end of the control unit 1025.

Herein, the voltage dropping amount of the second voltage dropping unit is greater than the voltage dropping amount of the first voltage dropping unit, and the voltage dropping amount of the second voltage dropping unit is in negative correlation with the drive capability of the write module.

When the sense amplifier 10 is in the non-write stage, the control unit 1025 controls the first voltage dropping unit to work, and after a voltage dropping process is performed on the voltage provided by the first power supply end Vcc by the first voltage dropping unit, the first voltage is output. When the sense amplifier 10 is in the write stage, the control unit 1025 controls the second voltage dropping unit 1024 to work, and after a voltage dropping process is performed on the voltage provided by the first power supply end Vcc is by the second voltage dropping unit 1024, the second voltage is output. The second voltage dropping unit 1024 may adaptively adjust the voltage dropping magnitude according to the drive capability of the write module. When the drive capability of the write module is strong, the voltage dropping amount of the second voltage dropping unit 1024 is reduced. When the drive capability of the write module is weak, the voltage dropping amount of the second voltage dropping unit 1024 is increased, so as to implement the positive correlation between the second voltage and the drive capability of the write module.

The process that the sense amplifier writes the data "1" to one memory cell 21 of the first memory array 20 is described below. The writing data includes an access stage, a sensing stage, a write stage and a recovery stage, and assuming that "0" is stored in the memory cell 21 before writing.

In the access stage, the voltage initial values of the bit line BL and the reference bit line BLB of the first memory array 20 are 0.5 $V_{CC}$. The first voltage dropping unit 1023 is controlled to work, and the second voltage dropping unit 1024 is controlled to stop working. After the first power supply end Vcc is subjected to voltage dropping by the first voltage dropping unit 1023, the first voltage is provided to the amplify module 101. The signal in the word line corresponding to the accessed memory cell 21 is also controlled, so that the access transistor T in the accessed memory cell 21 is conductive, and the storage capacitor C enables the voltage of the bit line BL to be changed. For example, if the data stored in the storage capacitor C is "0", the storage capacitor C enables the voltage of the bit line BL to be descended, and the voltage of the bit line BL is less than 0.5 Vcc, namely, the bit line BL charges to the storage capacitor C, and the current flows to the storage capacitor C from the bit line BL.

In the sensing stage, the first voltage dropping unit 1023 is controlled to work, and the second voltage dropping unit 1024 is controlled to stop working. After the first power supply end Vcc is subjected to voltage dropping by the first voltage dropping unit 1023, the first voltage is provided to the amplify module 101. The voltage difference between the bit line BL and the reference bit line BLB is amplified by the amplify module 101, so that the voltage of the reference bit line BLB ascends towards the first voltage direction, and the voltage of the bit line BL descends towards the GND direction.

In the write stage, the first voltage dropping unit 1023 is controlled to stop working, and the second voltage dropping unit 1024 is controlled to recover working. After the first power supply end Vcc is subjected to voltage dropping by the second voltage dropping unit 1024, the second voltage is provided to the amplify module 101, and the second voltage dropping unit 1024 adjusts its voltage dropping amount according to the drive capability of the write module. The capability of the amplify module 101 to pull the voltage of the bit line BL and the voltage of the reference bit line BLB is weakened, and the drive capability of the write module and the capability of the amplify module to pull the voltage of the bit line and the voltage of the reference bit line in the write stage are balanced. In addition, the column selection signal is controlled, the voltage of the bit line BL and the voltage of the reference bit line BLB are pulled by the write circuit according to the voltage corresponding to the logic data "1", namely, the voltage of the bit line BL is pulled upwards, and the voltage of the BLB is pulled downwards, so that the voltage of the bit line BL is higher than the voltage of the reference bit line BLB.

In the recovery stage, the first voltage dropping unit 1023 is controlled to work, and the second voltage dropping unit 1024 is controlled to stop working. After the first power supply end Vcc is subjected to voltage dropping by the first voltage dropping unit 1023, the first voltage is provided to the amplify module 101, and the influence of the amplify module on the voltage of the bit line BL and the voltage of the reference bit line BLB is recovered. The amplify module 101 amplifies the voltage difference between the bit line BL and the reference bit line BLB and stabilizes the voltage difference at Vcc, the bit line BL also charges the storage capacitor C, and after charging for a period of time, the data "1" is written in the storage capacitor C. The access transistor T is cut off through controlling a signal in the word line, and then writing the logic data "0" is completed.

In the above technical solution, after the control unit controls the second voltage dropping unit to perform the voltage dropping on the first power supply end in the write stage, second voltage is provided to the amplify module. The capacity of the amplify module 101 to pull the voltage of the bit line BL and the voltage of the reference bit line BLB is weakened, and the capacities of the write module and the amplify module to pull the voltage of the bit line and the voltage of the reference bit line in the write stage are balanced, so as to ensure that the write module can also pull the voltage of the bit line and the voltage of the reference bit line according to the data to be written when the drive capability of the write module is weaker, thereby realizing writing the data to be written in the memory cell.

Figure 6:
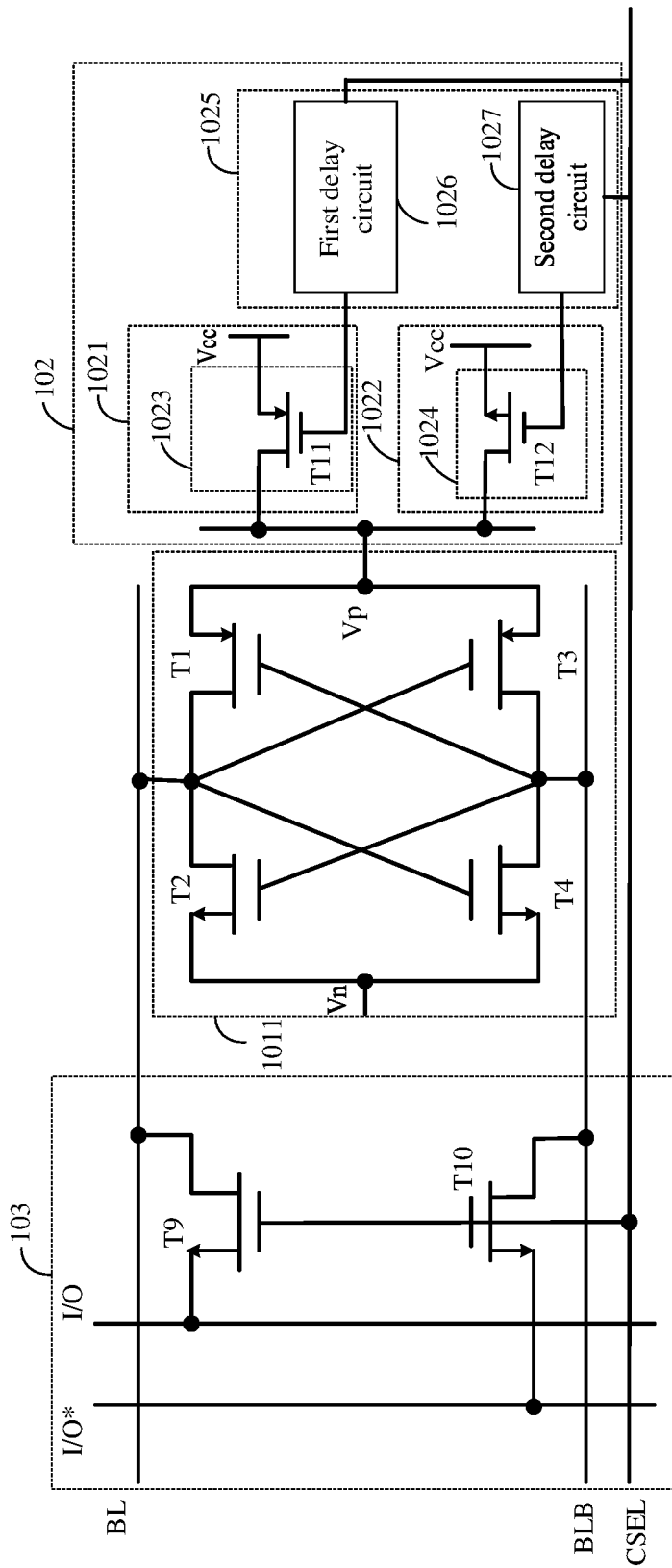
FIG. 6 is a circuit structure diagram of a sense amplifier according to another embodiment of this disclosure.

As illustrated in FIG. 6, another embodiment of this disclosure provides a sense amplifier, which includes an amplify module 101, a controllable power module 102 and a write module 103. Herein, the amplify module 101 is connected to the controllable power module 102, the bit line BL and the reference bit line BLB, and the write module 103 is connected to the bit line BL and the reference bit line BLB.

The amplify module 101 includes at least one cross-coupled amplify circuit 1011. The at least one cross-coupled amplify circuit 1011 is provided with a first end Vp, a second end Vn, a third end and a fourth end. The first end Vp of the cross-coupled amplify circuit 1011 is connected to an output end of the controllable power unit 102, the second end Vn of the cross-coupled amplify circuit 1011 is grounded, the third end of the cross-coupled amplify circuit 1011 is connected to the bit line BL, and the fourth end of the cross-coupled amplify circuit is connected to the reference bit line BLB.

Herein, the cross-coupled amplify circuit 1011 includes a first transistor T1, a second transistor T2, a third transistor T3 and a fourth transistor T4.

A first end of the first transistor T1 is the first end Vp of the cross-coupled amplify circuit 1011, a second end of the second transistor T2 is the second end Vn of the cross-coupled amplify circuit 1011, a second end of the first transistor T1 is the third end of the cross-coupled amplify circuit 1011, and a second end of the third transistor T3 is the fourth end of the cross-coupled amplify circuit 1011.

A second end of the first transistor T1 is connected to a first end of the second transistor T2, the second end of the third transistor T3 is connected to a first end of the fourth transistor T4, the first end of the first transistor T1 is connected to a first end of the third transistor T3, and the second end of the second transistor T2 is connected to a second end of the fourth transistor T4.

The control end of the first transistor T1 is connected to the second end of the third transistor T3, the control end of the second transistor T2 is connected to the second end of the third transistor T3, the control end of the third transistor T3 is connected to the second end of the first transistor T1, and the control end of the fourth transistor T4 is connected to the second end of the first transistor T1.

The controllable power module 102 includes a first controllable power unit 1021 and a second controllable power unit 1022. An output end of the first controllable power unit 1021 is connected to a first end of the amplify module 101, an output end of the second controllable power unit 1022 is connected to the first end of the amplify module 101, a control unit 1025 is connected to a control end of the first controllable power unit 1021, and the control unit 1025 is also connected to a control end of the second controllable power unit 1022.

The first controllable power unit 1021 includes a first voltage dropping unit 1023, and the second controllable power unit 1022 includes a second voltage dropping unit 1024. Herein, the first voltage dropping unit 1023 is an eleventh transistor T11, and the second voltage dropping unit 1024 is a twelfth transistor T12.

The control unit 1025 includes a first delay circuit 1026 and a second delay circuit 1027. An input end of the first delay circuit 1026 is connected to a column selection line, and an output end of the first delay circuit 1026 is connected to the eleventh transistor T11. An input end of the second delay circuit 1027 is connected to the column selection line, and an output end of the second delay circuit 1027 is connected to the twelfth transistor T12.

A first end of the eleventh transistor T11 is connected to the first power supply end Vcc, a second end of the eleventh transistor T11 is connected to the first end Vp of the cross-coupled amplify circuit 1011, and the control end of the eleventh transistor T11 is connected to the first output end of the first delay circuit 1026.

A first end of the twelfth transistor T12 is connected to the first power supply end Vcc, a second end of the twelfth transistor T12 is connected to the first end Vp of the cross-coupled amplify circuit 1011, and the control end of the twelfth transistor T12 is connected to the output end of the second delay circuit 1027.

The first delay circuit 1026 is configured to obtain a first control signal for controlling the eleventh transistor T11 after performing the delay process on the column selection signal. The second delay circuit 1027 is configured to obtain a second control signal for controlling the twelfth transistor T12 after performing the delay process on the column selection signal. Herein, the delay time of the first delay circuit is shorter than the delay time of the second delay circuit.

The write module 103 includes a ninth transistor T9 and a tenth transistor T10. A second end of the ninth transistor T9 is configured to receive the data to be written, a first end of the ninth transistor T9 is connected to the bit line BL, and a control end of the ninth transistor T9 is connected to the column selection line CSEL. The ninth transistor T9 is configured to pull the voltage of the bit line BL according to the data to be written.

A second end of the tenth transistor T10 is configured to receive the data to be written, a first end of the tenth transistor T10 is connected to the reference bit line BLB, a control end of the tenth transistor T10 is connected to the column selection line CSEL, and the tenth transistor T10 is configured to pull the voltage of the reference bit line BLB according to the data to be written.

In another embodiment, the first transistor T1 and the third transistor T3 are P-type transistors, and the second transistor T2 and the fourth transistor T4 are N-type transistors. The ninth transistor and the tenth transistor are N-type transistors, the eleventh transistor T11 is the P-type transistor, and the twelfth transistor T12 is the N-type transistor.

The drive capability of the ninth transistor T9 is in positive correlation with a process corner parameter of the ninth transistor T9, and the drive capability of the tenth transistor T10 is in positive correlation with a process corner parameter of the tenth transistor T10. That is to say, the quicker the process corner of the ninth transistor T9, the smaller the threshold voltage $V_{THN}$ of the ninth transistor T9, and the stronger the drive capability of the ninth transistor T9. The slower the process corner of the ninth transistor T9, the greater the threshold voltage $V_{THN}$ of the ninth transistor T9, and the weaker the drive capability of the ninth transistor T9. The tenth transistor T10 is the same, and details are not made herein.

The ninth transistor and the tenth transistor are N-type transistors, and the twelfth transistor T12 is the N-type transistor. That is to say, the twelfth transistor T12 has the same characteristic, the quicker the process corner of the twelfth transistor T12, the smaller the threshold voltage $V_{THN}$ of the twelfth transistor T12. The slower the process corner of the twelfth transistor T12, the greater the threshold voltage $V_{THN}$ of the twelfth transistor T12.

During a manufacturing process of an integrated chip, the N-type transistors on the same integrated chip have the same process corner parameter, that is to say, if process corners of the ninth transistor T9 and the tenth transistor T10 are quicker, the threshold voltages $V_{THN}$ of the ninth transistor T9 and the tenth transistor T10 are smaller, and the drive capabilities are stronger. The process corner of the twelfth transistor T12 is quicker, the threshold voltage $V_{THN}$ of the twelfth transistor T12 is smaller, the voltage dropping amount of the twelfth transistor T12 is smaller, and the magnitude of the second voltage is greater, and vice versa. The second voltage provided by the twelfth transistor T12 is in positive correlation with the drive capability of the ninth transistor T9 and the tenth transistor T10.

The twelfth transistor T12 is the N-type transistor, when the N-type transistor is closed, the second voltage provided by the second controllable power unit is the gate voltage of the N-type transistor subtracting the threshold voltage $V_{THN}$. The gate voltage is provided by the control unit, and if the gate voltage is Vcc, the second voltage is $V_{CC}$-$V_{THN}$. However, the eleventh transistor T11 is the P-type transistor, when the P-type transistor is closed, the first voltage dropping amount is the drain voltage $V_{DS}$ of a positive channel Metal Oxide Semiconductor (PMOS), the drain voltage $V_{DS}$ is close to 0, and the first voltage provided by the first controllable power unit is close to Vcc. The first voltage dropping amount of the eleventh transistor T11 is less than the second voltage dropping amount of the twelfth transistor T12.

The process of writing the data in the memory cell via the sense amplifier 10 is described below in combination with FIG. 7, FIG. 8A, FIG. 8B and FIG. 8C.

Figure 7:
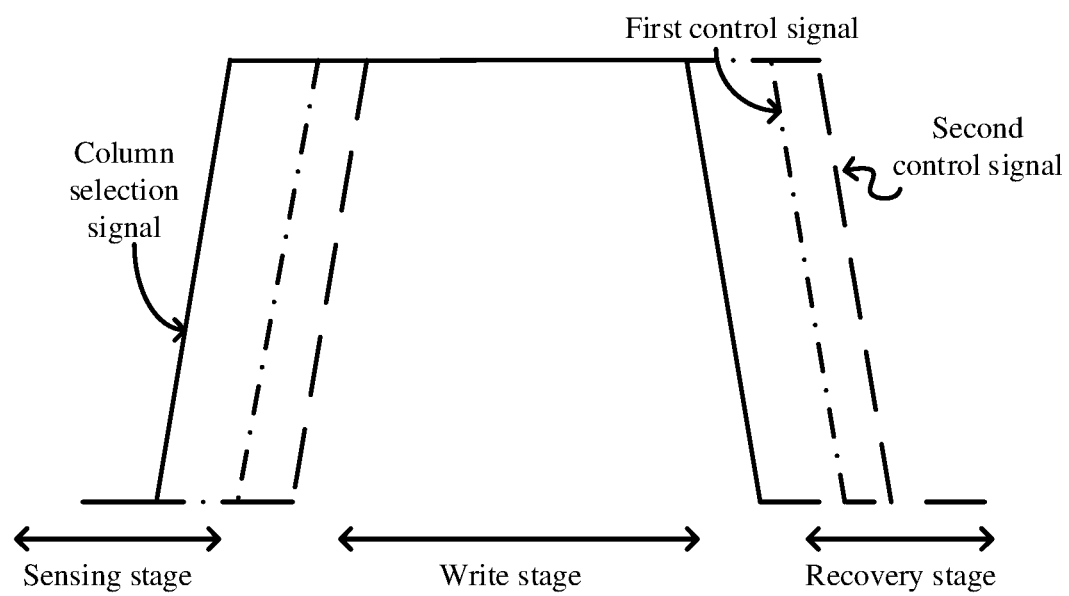
FIG. 7 is a relationship schematic diagram of a control signal and a column selection signal according to another embodiment of this disclosure.

As illustrated in FIG. 7, the column selection signal is in a high level in the write stage, and the column selection signal is in a low level in the sensing stage and the recovery stage.

After the column selection signal is subjected to a delay process by the first delay circuit, the first control signal is in the high level in the write stage and in the low level in the sensing stage and recovery stage.

After the column selection signal is subjected to a buffer process by the second delay circuit, the second control signal is in the high level in the write stage and in the low level in the sensing stage and recovery stage.

In the sensing stage, the first control signal is in the low level, the second control signal is in the low level, the eleventh transistor T11 is closed, the twelfth transistor T12 is disconnected, and after the first power supply end Vcc is subjected to voltage dropping by the eleventh transistor T11, the first power supply end Vcc provides the first voltage to the amplify module 101. "1" is stored in the memory cell 21 before writing. The voltage difference between the bit line BL and the reference bit line BLB is amplified by the amplify module 101, so that the voltage of the bit line BL continue to ascend towards the first voltage direction, and the voltage of the reference bit line BLB descends towards the GND direction.

In the write stage, the first control signal is in the high level, the second control signal is in the high level, the eleventh transistor T11 is disconnected, the twelfth transistor T12 is closed, and after the first power supply end Vcc is subjected to voltage dropping by the twelfth transistor T12, the first power supply end Vcc provides the second voltage to the amplify module 101.

Figure 8A:
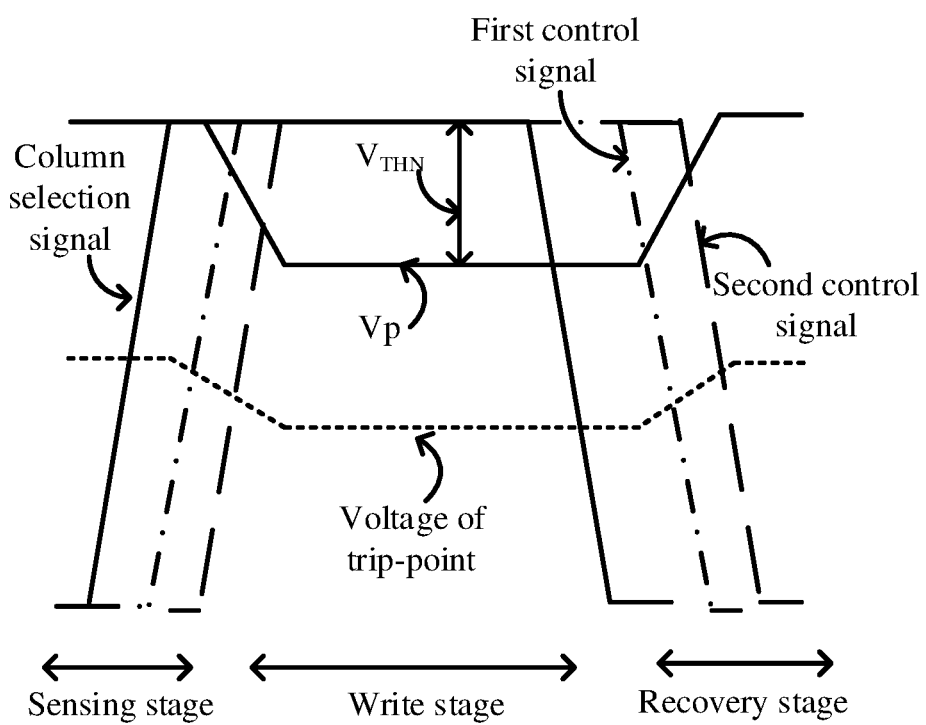
FIG. 8A is a schematic diagram of voltage change of a sense amplifier according to another embodiment of this disclosure.

As illustrated in FIG. 8A, when the process corners of the ninth transistor T9 and the tenth transistor T10 are slower, the drive capabilities of the ninth transistor T9 and the tenth transistor T10 are weaker, the threshold voltage $V_{THN}$ of the twelfth transistor T12 is greater, and the second voltage provided by the twelfth transistor T12 is smaller.

Figure 8B:
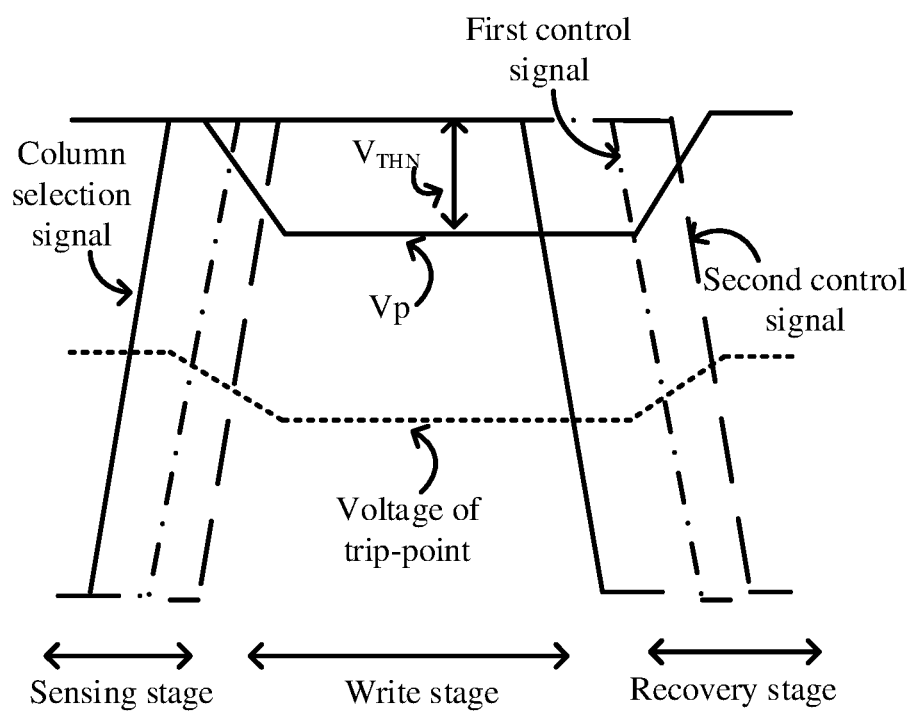
FIG. 8B is another schematic diagram of voltage change of a sense amplifier according to another embodiment of this disclosure.

As illustrated in FIG. 8B, when the process corners of the ninth transistor T9 and the tenth transistor T10 are moderate, the drive capabilities of the ninth transistor T9 and the tenth transistor T10 are moderate, the threshold voltage $V_{THN}$ of the twelfth transistor T12 is moderate, and the second voltage provided by the twelfth transistor T12 is moderate.

Figure 8C:
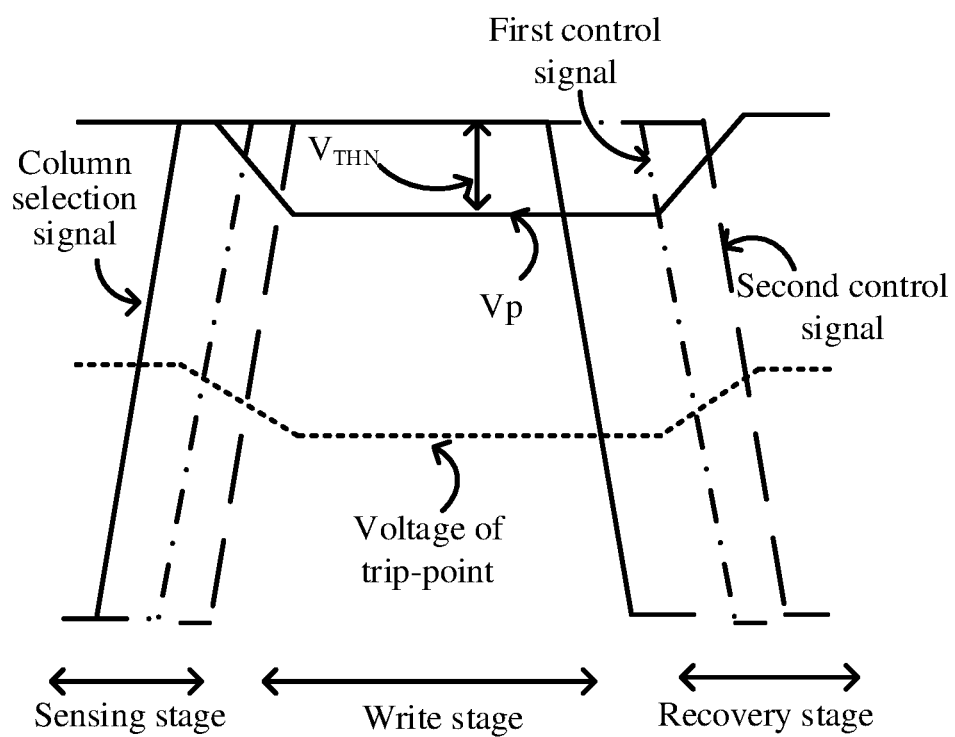
FIG. 8C is another schematic diagram of voltage change of a sense amplifier according to another embodiment of this disclosure.

As illustrated in FIG. 8C, when the process corners of the ninth transistor T9 and the tenth transistor T10 are quicker, the drive capabilities of the ninth transistor T9 and the tenth transistor T10 are stronger, the threshold voltage $V_{THN}$ of the twelfth transistor T12 is smaller, and the second voltage provided by the twelfth transistor T12 is greater.

A second voltage that is too low is not required in a case that the drive capabilities of the ninth transistor T9 and the tenth transistor T10 are stronger. A second voltage that is too low will result in a long time that the second voltage is switched back to the first voltage after the write stage is end. The value of the second voltage is adjusted according to the drive capabilities of the ninth transistor T9 and the tenth transistor T10, so that the time of switching the second voltage back to the first voltage may be shortened.

In the write stage, the column selection signal is in the high level, when the write data is "1", the ninth transistor T9 and the tenth transistor T10 are conductive, the ninth transistor T9 pulls the voltage of the bit line BL upwards, and the tenth transistor T10 pulls the voltage of the reference bit line BLB downwards. When the write data is "0", the ninth transistor T9 and the tenth transistor T10 are conductive, the ninth transistor T9 pulls the voltage of the bit line BL downwards, and the tenth transistor T10 pulls the voltage of the reference bit line BLB upwards.

In the recovery stage, the first control signal is in the low level, the second control signal is in the low level, the eleventh transistor T11 is closed, the twelfth transistor T12 is disconnected, and after the first power supply end Vcc is subjected to voltage dropping by the eleventh transistor T11, the first power supply end Vcc provides the first voltage to the amplify module 101. The amplify module 101 stabilizes the voltage of the bit line BL and the voltage of the reference bit line BLB at the data to be written, the bit line BL also charges the storage capacitor C, and after charging for a period of time, the data to be written is written in the storage capacitor C. The access transistor is cut off by controlling a signal in the word line, and then the data write is completed.

In the above process, the second voltage is provided to the amplify module in the write stage. After the column selection signal is turned on, the bit line BL is pulled to the voltage Vtrip of the trip-point, and after the column selection signal is turned on, the reference bit line BLB is pulled to the voltage Vtrip of the trip-point, so as to form positive feedback to turn over the sense amplifier. The data to be written may be stably presented on the bit line BL and the reference bit line BLB, thereby realizing successfully writing data when the drive capability is weak.

In the above technical solution, the control signal of the eleventh transistor (P-type transistor) and the twelfth transistor (N-type transistor) are generated according to the column selection signal, so as to realize weakening the capability of the amplify module to pull the voltage of the bit line and the voltage of the reference bit line in the write stage, balancing the drive capability of the write module and the capability of the amplify module to pull the voltage of the bit line and the voltage of the reference bit line in the write stage; and recovering, in the recovery stage, the capability of the amplify module to pull the voltage of the bit line and the voltage of the reference bit line, so as to ensure to simplify the control unit structure and improve the reliability of the sense amplifier when successfully writing the data.

Figure 9:
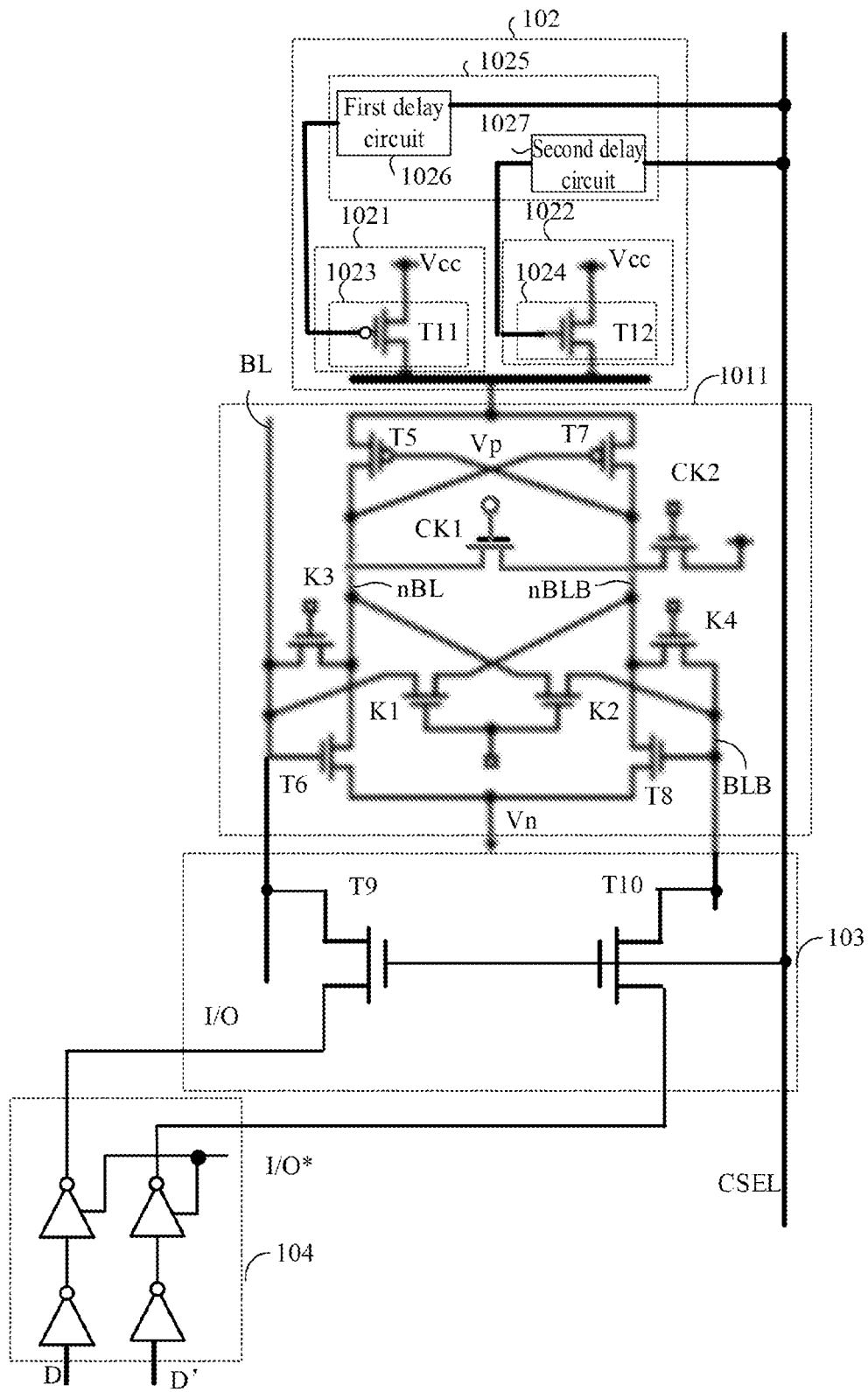
FIG. 9 is a circuit structure diagram of a sense amplifier according to another embodiment of this disclosure.

As illustrated in FIG. 9, another embodiment of this disclosure provides a sense amplifier 10, which includes an amplify module 101, a controllable power module 102, a write module 103 and a drive module 104. Herein, the amplify module 101 is connected to the controllable power module 102, the write module 103 is connected to the bit line BL, the write module 103 is also connected to the reference bit line BLB, and the drive module 104 is connected to the write module 103.

The amplify module 101 includes at least one cross-coupled amplify circuit 1011, the at least one cross-coupled amplify circuit 1011 is provided with a first end Vp, a second end Vn, a third end and a fourth end. The first end Vp of the cross-coupled amplify circuit 1011 is connected to an output end of the controllable power unit 102, the second end Vn of the cross-coupled amplify circuit is grounded, the third end of the cross-coupled amplify circuit 1011 is connected to the bit line BL, and the fourth end of the cross-coupled amplify circuit 1011 is connected to the reference bit line BLB.

Herein, the cross-coupled amplify circuit 1011 is a single cross-coupled amplify circuit, which has an offset elimination function. The cross-coupled amplify circuit 1011 specifically includes a fifth transistor T5, a sixth transistor T6, a seventh transistor T7, an eighth transistor T8, a first switch K1, a second switch K2, a third switch K3 and a fourth switch K4.

A first end of the fifth transistor T5 is the first end Vp of the cross-coupled amplify circuit 1011, a second end of the sixth transistor T6 is the second end Vn of the cross-coupled amplify circuit 1011, a second end of the fifth transistor T5 is the third end of the cross-coupled amplify circuit 1011, and a second end of the seventh transistor T7 is the fourth end of the cross-coupled amplify circuit 1011.

A second end of the fifth transistor T5 is connected to a first end of the sixth transistor T6, the second end of the seventh transistor T7 is connected to a first end of the eighth transistor T8, the first end of the fifth transistor T5 is connected to a first end of the seventh transistor T7, and a second end of the sixth transistor T6 is connected to a second end of the eighth transistor T8.

A control end of the fifth transistor T5 is connected to the second end of the seventh transistor T7, a control end of the sixth transistor T6 is connected to the second end of the seventh transistor T7 through the first switch K1, and the control end of the sixth transistor T6 is connected to the first end of the sixth transistor T6 through the third switch K3.

The control end of the seventh transistor T7 is connected to the second end of the fifth transistor T5, the control end of the eighth transistor T8 is connected to the second end of the fifth transistor T5 through the second switch K2, the control end of the eighth transistor T8 is connected to the first end of the eighth transistor T8 through the fourth switch K4.

The controllable power module 102 includes a first controllable power unit 1021 and a second controllable power unit 1022. An output end of the first controllable power unit 1021 is connected to a first end of the amplify module 101, an output end of the second controllable power unit 1022 is connected to the first end of the amplify module 101. T control unit 1025 is connected to a control end of the first controllable power unit 1021, and the control unit 1025 is also connected to a control end of the second controllable power unit 1022.

The first controllable power unit 1021 includes a first voltage dropping unit 1023, and the second controllable power unit 1022 includes a second voltage dropping unit 1024. Herein, the first voltage dropping unit 1023 is an eleventh transistor T11, and the second voltage dropping unit 1024 is a twelfth transistor T12.

A first end of the eleventh transistor T11 is connected to the first power supply end Vcc, a second end of the eleventh transistor T11 is connected to the first end Vp of the cross-coupled amplify circuit 1011, and the control end of the eleventh transistor T11 is connected to the first output end of the first delay circuit 1026.

A first end of the twelfth transistor T12 is connected to the first power supply end Vcc, a second end of the twelfth transistor T12 is connected to the first end Vp of the cross-coupled amplify circuit 1011, and the control end of the twelfth transistor T12 is connected to the output end of the second delay circuit 1027.

The first delay circuit 1026 is configured to obtain the first control signal for controlling the first voltage dropping unit after performing a delay process on the column selection signal. The second delay circuit 1027 is configured to obtain the second control signal for controlling the second voltage dropping unit after performing a delay process on the column selection signal. Herein, the delay time of the first delay circuit is shorter than the delay time of the second delay circuit.

The write module 103 includes a ninth transistor T9 and a tenth transistor T10. A second end of the ninth transistor T9 is configured to receive the data to be written, a first end of the ninth transistor T9 is connected to the bit line BL, and a control end of the ninth transistor T9 is connected to the column selection line CSEL. The ninth transistor T9 is configured to pull the voltage of the bit line BL according to the data to be written.

A second end of the tenth transistor T10 is configured to receive the data to be written, a first end of the tenth transistor T10 is connected to the reference bit line BLB, a control end of the tenth transistor T10 is connected to the column selection line CSEL, and the tenth transistor T10 is configured to pull the voltage of the reference bit line BLB according to the data to be written.

The fifth transistor T5, the seventh transistor T7 and the eleventh transistor T11 are P-type transistors, and the sixth transistor T6, the eighth transistor T8, the ninth transistor T9, the tenth transistor T10 and the twelfth transistor T12 are N-type transistors.

The drive module includes two sets of inverters, and each set of inverters include two cascaded inverters. Herein, one set of inverters is connected to the second end of the ninth transistor T9, the other set of inverters is connected to the second end of the tenth transistor T10; one set of inverters is configured to receive the data D to be written, and the other set of inverters is configured to receive the inverted data D' to be written.

The process of writing the data to the memory cell 21 by the sense amplifier 10 is described below.

For easy description, the connecting line between the second end of the fifth transistor T5 and the first end of the sixth transistor T6 is called as an inner bit line nBL of the first memory array 20, and the connecting line between the second end of the seventh transistor T7 and the first end of the eighth transistor T8 is called as an inner reference bit line nBLB in the first memory array 20.

In an offset elimination stage, the initial voltages of the bit line BL, the reference bit line BLB, inner bit line nBL and the inner reference bit line nBLB are 0.5 $V_{CC}$. The first control signal is in the low level, the second control signal is in the low level, the eleventh transistor T11 is closed, the twelfth transistor T12 is disconnected, and after the first power supply end Vcc is subjected to voltage dropping by the eleventh transistor T11, the first power supply end Vcc provides the first voltage to the amplify module 101. The first switch K1 and the second switch K2 are disconnected, and the third switch K3 and the fourth switch K4 are closed. The first end of the sixth transistor T6 is in short connection with the control end, the first end of the eighth transistor T8 is in short connection with the control end, and the two N-type transistors are connected by a diode. The two transistors connected by the diode have difference in manufacturing, so an compensation voltage is generated on the bit line BL and the reference bit line BLB, and the compensation voltage may eliminate the manufacturing difference (called as misalignment voltage) of the transistors of the N-type transistor pair or the P-type transistor pair. For example, the voltage on the bit line BL subtracting the voltage on the reference bit line BLB is equal to the misalignment voltage, or the voltage on the reference bit line BLB subtracting the voltage on the bit line 40 is equal to the misalignment voltage.

In the sensing stage, the initial voltages of the bit line BL, the reference bit line BLB, the inner bit line nBL and inner reference bit line nBLB are 0.5 Vcc. The first control signal is in the low level, the second control signal is in the low level, the eleventh transistor T11 is closed, the twelfth transistor T12 is disconnected, and after the first power supply end Vcc is subjected to voltage dropping by the eleventh transistor T11, the first power supply end Vcc provides the first voltage to the amplify module 101. The first switch K1 and the second switch K2 are closed, and the third switch K3 and the fourth switch K4 are disconnected. Assuming that "1" is stored in the memory cell 21 before writing. The voltage difference between the bit line BL and the reference bit line BLB is amplified by the amplify module 101, so that the voltage of the bit line BL continue to ascend towards the first voltage direction, and the voltage of the reference bit line BLB descends towards the GND direction.

In the write stage, the first control signal is in the high level, the second control signal is in the high level, the eleventh transistor T11 is disconnected, the twelfth transistor T12 is closed, and after the first power supply end Vcc is subjected to voltage dropping by the twelfth transistor T12, the first power supply end Vcc provides the second voltage to the amplify module 101. The first switch K1 and the second switch K2 are closed, and the third switch K3 and the fourth switch K4 are disconnected. The column selection signal is in the high level, when the write data is "1", the ninth transistor T9 and the tenth transistor T10 are conductive, the ninth transistor T9 pulls the voltage of the bit line BL upwards, and the tenth transistor T10 pulls the voltage of the reference bit line BLB downwards; and when the write data is "0", the ninth transistor T9 and the tenth transistor T10 are conductive, the ninth transistor T9 pulls the voltage of the bit line BL downwards, and the tenth transistor T10 pulls the voltage of the reference bit line BLB upwards.

In the recovery stage, the first control signal is in the low level, the second control signal is in the low level, the eleventh transistor T11 is closed, the twelfth transistor T12 is disconnected, and after the first power supply end Vcc is subjected to voltage dropping by the eleventh transistor T11, the first power supply end Vcc provides the first voltage to the amplify module 101. The first switch K1 and the second switch K2 are closed, and the third switch K3 and the fourth switch K4 are disconnected. The two P-type transistors form a cross-coupled inverter, and the two N-type transistor also form the cross-coupled inverter. The amplify module 101 stabilizes the voltage of the bit line BL and the voltage of the reference bit line BLB at the data to be written, the bit line BL also charges the storage capacitor C, and after charging for a period of time, the data to be written is written in the storage capacitor C. The access transistor is cut off by controlling a signal in the word line, and then the data write is completed.

In the above technical solution, the control signal of the eleventh transistor (P-type transistor) and the twelfth transistor (N-type transistor) are generated according to the column selection signal, so as to realize weakening the capability of the amplify module to pull the voltage of the bit line and the voltage of the reference bit line in the write stage, balancing the drive capability of the write module and the capability of the amplify module to pull the voltage of the bit line and the voltage of the reference bit line in the write stage; recovering in the recovery stage the capability of the amplify module to pull the voltage of the bit line and the voltage of the reference bit line, so as to ensure to simplify the control unit structure and improve the reliability of the sense amplifier when successfully writing the data.

Figure 10:
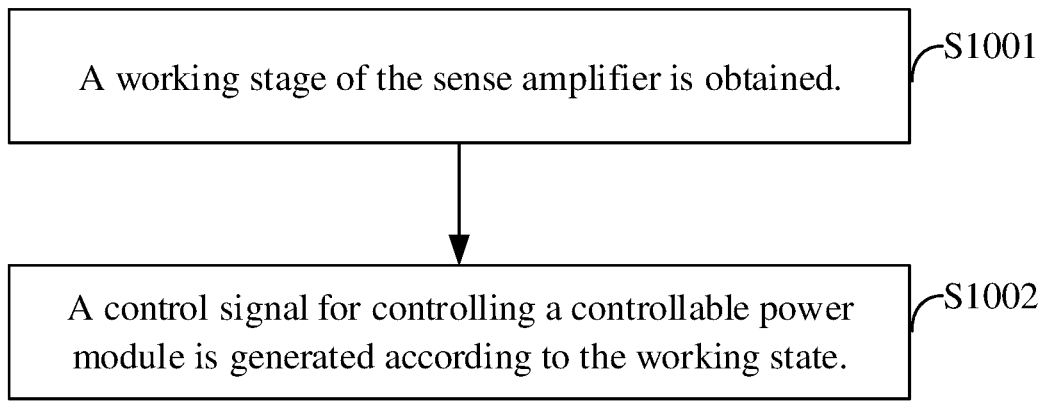
FIG. 10 is a flow schematic diagram of a method for controlling a sense amplifier according to another embodiment of this disclosure.

As illustrated in FIG. 10, an embodiment of this disclosure provides a method for controlling a sense amplifier 10. The structure of the sense amplifier has been described in above embodiments in details, and details are not made herein. The control method includes the following operations.

At S1001, a working stage of the sense amplifier is obtained.

The working state includes a write stage and a non-write stage. The non-write data specifically includes an access stage, a sensing stage and a recovery stage.

At S1002, a control signal for controlling the controllable power module is generated according to the working state.

Herein, the control signal for controlling the controllable power module to provide a second voltage to an amplify module is generated in the write stage, so as to weaken the drive capability of the amplify module in the write stage. At this time, the write module pulls the voltage of the bit line and the voltage of the reference bit line according to the data to be written. In the non-write stage, a control signal for controlling the controllable power module to provide a first voltage to the amplify module is generated to recover the capability of the amplify module to pull the voltage of the bit line and the voltage of the reference bit line, so that the amplify module stabilizes the voltage of the bit line and the voltage of the reference bit line at the data to be written, the bit line also charges the storage capacitor, and after charging for a period of time, the data to be written is written in the storage capacitor C.

In another embodiment, the controllable power module 102 includes a first controllable power unit 1021 and a second controllable power unit 1022. The first controllable power unit 1021 includes a first voltage dropping unit 1023, and the second controllable power unit 1022 includes a second voltage dropping unit 1024. Herein, the first voltage dropping unit 1023 is an eleventh transistor T11, and the second voltage dropping unit 1024 is a twelfth transistor T12.

A first end of the eleventh transistor T11 is connected to the first power supply end Vcc, a second end of the eleventh transistor T11 is connected to the first end Vp of the cross-coupled amplify circuit 1011, and the control end of the eleventh transistor T11 is connected to the control module 1025. A first end of the twelfth transistor T12 is connected to the first power supply end Vcc, a second end of the eleventh transistor T11 is connected to the first end Vp of the cross-coupled amplify circuit 1011, and the control end of the eleventh transistor T11 is connected to an output end of the control module 1025.

The control signal for controlling the controllable power module is generated according to the column selection signal, so that the twelfth transistor is closed in the write stage, and the second voltage is provided to the amplify module; and the eleventh transistor is closed in the non-write stage, and the first voltage is provided to the amplify module.

Optionally, when the eleventh transistor T11 is a P-type transistor and the twelfth transistor T12 is a N-type transistor, a delay process is performed on the column selection signal to generate a first control signal for controlling the eleventh transistor, and to generate a second control signal for controlling the twelfth transistor.

In the above technical solution, the controllable power module provides the second voltage to the amplify module in the write stage, to weaken the capability of the amplify module to pull the voltage of the bit line and the voltage of the reference bit line, and the second voltage is in positive correlation with the drive capability of the write module, so as to balance the capability of the write module and the capability of the amplify module to pull the voltage of the bit line and the voltage of the reference bit line, thereby realizing successfully presenting the data to be written on the bit line and the reference bit line when the drive capability of the write module is weak, and successfully writing data in the memory cell.

Finally, it should be noted that the above embodiments are merely used for illustrating the technical solutions of this application instead of limiting it. Although this application is described in details with reference to the abovementioned embodiments, those of ordinary skill in the art should understand that they can still make modifications to the technical solutions recorded in the abovementioned embodiments, or make equivalent replacements to part or all of technical characteristics. However, these modifications or replacement do not make the essence of the corresponding technical solutions depart from the technical solutions of various embodiments of this application.

What is claimed is:

1. A sense amplifier, comprising:
    an amplify circuit, configured to amplify a voltage difference between a bit line and a reference bit line when the sense amplifier is in an amplifying stage;
    a write circuit, connected to the bit line and the reference bit line, and configured to pull the voltage difference between the bit line and the reference bit line according to data to be written into memory cells the sense amplifier is in a write stage; and
    a controllable power circuit, connected to the amplify circuit, configured to provide a first voltage to the amplify circuit when the sense amplifier is in a non-write stage, and to provide a second voltage to the amplify circuit when the sense amplifier in the write stage; wherein the second voltage is less than the first voltage, and the second voltage is in positive correlation with a drive capability of the write circuit;
    wherein a process of writing the data into the memory cells comprises an access stage, a sensing stage, the write stage and a recover stage; and the non-write data stage comprises the access stage, the sending stage and the recover stage.

2. The sense amplifier of claim 1, wherein the controllable power circuit comprises:
    a first controllable power circuit, connected to a first end of the amplify circuit, and configured to provide the first voltage to the amplify circuit;
    a second controllable power circuit, connected to the first end of the amplify circuit, and configured to provide the second voltage to the amplify circuit; and
    a control circuit, connected to the first controllable power circuit and the second controllable power circuit, configured to control the first controllable power circuit to provide the first voltage to the amplify circuit during the non-write stage, and configured to control the second controllable power circuit to provide the second voltage to the amplify circuit in the write stage.

3. The sense amplifier of claim 2, wherein the first controllable power circuit comprises:
    a first voltage dropping circuit, provided with a first end connected to a first power supply end, a second end connected to the first end of the amplify circuit, and a control end connected to a first output end of the control circuit.

4. The sense amplifier of claim 3, wherein the second controllable power circuit comprises:
    a second voltage dropping circuit, provided with a first end connected to the first power supply end, a second end connected to the first end of the amplify circuit and a control end connected to a second output end of the control circuit, wherein a voltage dropping amount of the second voltage dropping circuit is greater than a voltage dropping amount of the first voltage dropping circuit, and the voltage dropping amount of the second voltage dropping circuit is in negative correlation with the drive capability of the write circuit.

5. The sense amplifier of claim 4, wherein the write circuit comprises:
    a ninth transistor, wherein a second end of the ninth transistor is configured to receive the data to be written into the memory cells, a first end of the ninth transistor is connected to the bit line, a control end of the ninth transistor is connected to a column selection line, and the ninth transistor is configured to pull a voltage of the bit line according to the data to be written into the memory cells; and
    a tenth transistor, wherein a second end of the tenth transistor is configured to receive the data to be written into the memory cells, a first end of the tenth transistor is connected to the reference bit line, a control end of the tenth transistor is connected to the column selection line, and the tenth transistor is configured to pull a voltage of the reference bit line according to the data to be written into the memory cells.

6. The sense amplifier of claim 5, wherein a drive capability of the ninth transistor is in positive correlation with a process corner parameter of the ninth transistor, and a drive capability of the tenth transistor is in positive correlation with a process corner parameter of the tenth transistor.

7. The sense amplifier of claim 5, wherein
    the ninth transistor and the tenth transistor are N-type transistors; and
    the first voltage dropping circuit comprises an eleventh transistor which is a P-type transistor; and the second voltage dropping circuit comprises a twelfth transistor which is a N-type transistor.

8. The sense amplifier of claim 7, wherein the control circuit comprises:
a first delay circuit, wherein an input end of the first delay circuit is connected to the column selection line, an output end of the first time-day circuit is connected to a control end of the eleventh transistor, and the first delay circuit is configured to obtain a first control signal for controlling the eleventh transistor after performing a delay process on a column selection signal;
a second delay circuit, wherein an input end of the second delay circuit is connected to the column selection line, an output end of the second delay circuit is connected to a control end of the twelfth transistor, and the second delay circuit is configured to obtain a second control signal for controlling the twelfth transistor after performing the delay process on the column selection signal; and
a delay time of the first delay circuit is less than a delay time of the second delay circuit.

9. The sense amplifier of claim 1, wherein the amplify circuit comprises:
at least one cross-coupled amplify circuit, provided with a first end connected to an output end of a first controllable power circuit and an output end of a second controllable power circuit, a second end being grounded, a third end connected to the bit line, and a fourth end connected to the reference bit line.

10. The sense amplifier of claim 9, wherein the at least one cross-coupled amplify circuit comprises a first transistor, a second transistor, a third transistor and a fourth transistor;
a first end of the first transistor is the first end of the at least one cross-coupled amplify circuit, a second end of the second transistor is the second end of the at least one cross-coupled amplify circuit, a second end of the first transistor is the third end of the at least one cross-coupled amplify circuit, and a second end of the third transistor is the fourth end of the at least one cross-coupled amplify circuit;
the second end of the first transistor is connected to a first end of the second transistor, the second end of the third transistor is connected to a first end of the fourth transistor, the first end of the first transistor is connected to a first end of the third transistor, and the second end of the second transistor is connected to a second end of the fourth transistor; and
a control end of the first transistor is connected to the second end of the third transistor, a control end of the second transistor is connected to the second end of the third transistor, a control end of the third transistor is connected to the second end of the first transistor, and a control end of the fourth transistor is connected to the second end of the first transistor.

11. The sense amplifier of claim 10, wherein the first transistor and the third transistor are P-type transistors, and the second transistor and the fourth transistor are N-type transistors.

12. The sense amplifier of claim 9, wherein the at least one cross-coupled amplify circuit comprises a fifth transistor, a sixth transistor, a seventh transistor, an eighth transistor, a first switch, a second switch, a third switch and a fourth switch;
a first end of the fifth transistor is the first end of the at least one cross-coupled amplify circuit, a second end of the sixth transistor is the second end of the at least one cross-coupled amplify circuit, a second end of the fifth transistor is the third end of the at least one cross-coupled amplify circuit, and a second end of the seventh transistor is the fourth end of the at least one cross-coupled amplify circuit;
the second end of the fifth transistor is connected to a first end of the sixth transistor, the second end of the seventh transistor is connected to a first end of the eighth transistor, the first end of the fifth transistor is connected to a first end of the seventh transistor, and the second end of the sixth transistor is connected to a second end of the eighth transistor;
a control end of the fifth transistor is connected to the second end of the seventh transistor, a control end of the sixth transistor is connected to the second end of the seventh transistor by the first switch, and the control end of the sixth transistor is connected to the first end of the sixth transistor by the third switch; and
a control end of the seventh transistor is connected to the second end of the fifth transistor, a control end of the eighth transistor is connected to the second end of the fifth transistor by the second switch, and the control end of the eighth transistor is connected to the first end of the eighth transistor by the fourth switch.

13. The sense amplifier of claim 12, wherein the fifth transistor and the seventh transistor are P-type transistors, and the sixth transistor and the eighth transistor are N-type transistors.

14. The sense amplifier of claim 1,
a drive circuit, connected to the write circuit and configured to perform an enhancement process on the data to be written into the memory cells.

15. A memory, comprising the sense amplifier of claim 1 and the memory cells;
wherein parts of the memory cells form a first memory array, other parts of the memory cells form a second memory array, the sense amplifier is located between the first memory array and the second memory array, a third end of the sense amplifier is connected to a bit line of the first memory array, and a fourth end of the sense amplifier is connected to a bit line of the second memory array.

16. A method for controlling a sense amplifier, wherein the sense amplifier comprises an amplify circuit, a controllable power circuit and a write circuit, and the method comprises:
obtaining a working state of the amplify circuit, and the working state comprising a write stage and a non-write stage; and
generating a control signal for controlling the controllable power circuit according to the working stage, to able the controllable power circuit to provide a first voltage to the amplify circuit in a non-write stage and to provide a second voltage to the amplify circuit in a write stage, and the second voltage is in positive correlation with a drive capability of a write circuit;
wherein a process of writing data into memory cells comprises an access stage, a sensing stage, the write stage and a recover stage; and the non-write data stage comprises the access stage, the sensing stage and the recovery stage.

17. The method of claim 16, wherein generating the control signal for controlling the controllable power circuit according to the working stage comprises:
generating the control signal for controlling the controllable power circuit according to a column selection signal.

* * * * *